(12) United States Patent
Sutardja et al.

(10) Patent No.: US 7,149,955 B1
(45) Date of Patent: Dec. 12, 2006

(54) ENCODING AND DECODING APPARATUS AND METHOD WITH HAMMING WEIGHT ENHANCEMENT

(75) Inventors: Pantas Sutardja, San Jose, CA (US); Toai Doan, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 289 days.

(21) Appl. No.: 10/074,747

(22) Filed: Feb. 11, 2002

Related U.S. Application Data

(60) Provisional application No. 60/273,511, filed on Mar. 7, 2001.

(51) Int. Cl.
*H03M 13/00* (2006.01)
*H03M 5/00* (2006.01)
*H04L 1/00* (2006.01)

(52) U.S. Cl. .................. 714/809; 714/776; 341/58

(58) Field of Classification Search ................ 714/776, 714/809; 341/58
See application file for complete search history.

(56) References Cited

U.S. PATENT DOCUMENTS

| 6,011,666 A | 1/2000 | Wakamatsu |
| 6,456,208 B1 * | 9/2002 | Nazari et al. .................. 341/59 |

* cited by examiner

*Primary Examiner*—Joseph D. Torres (57) ABSTRACT

A Hamming weight encoder includes an input that receives user data including P symbols and a Hamming weight module that determines a Hamming weight of N of said P symbols. N and P are integers greater than one and N is less than or equal to P. The Hamming weight encoder also includes a comparing module that compares the Hamming weight to a Hamming weight threshold and an inverting module that selectively bitwise inverts bits in said N symbols based on said comparison.

80 Claims, 3 Drawing Sheets

(Prior Art)

FIG. 4

(Prior Art)

ENCODING AND DECODING APPARATUS AND METHOD WITH HAMMING WEIGHT ENHANCEMENT

INCORPORATION BY REFERENCE OF RELATED APPLICATION

The present application is related to U.S. Provisional Patent Application Ser. No. 60/273,511, entitled "Hamming Weight Encoding Scheme With Permutation Relative To ECC," filed Mar. 7, 2001, which names as inventors Pantas Sutardja and Toai Doan (the inventors of the present invention), and which is hereby incorporated herein by reference.

BACKGROUND

1. Field of the Invention

The present invention relates generally to encoding and decoding for data transfer and, more particularly, to a method and apparatus for use in encoding and/or data by providing for a Hamming weight enhancement to the data.

2. Related Art

Data is frequently stored and/or communicated in binary form, that is, as a sequence of binary digits or bits having zero and one values. When such data is communicated or simply transferred to a storage medium, such as occurs in the operation of a disk drive, for example, there is a substantial risk of transmission errors (e.g., a one-valued bit being received when a zero-valued bit was transmitted or vice-versa) caused by noise in the communication channel and other factors. These transmission errors are especially significant when data compression techniques are used to reduce the number of bits needed to communicate a particular message (e.g., in a disk drive or, more generally, in a communication channel), because a single erroneous bit in a compressed message can result in corruption of a larger amount of information in the message after the message is decompressed. Disk drives, of course, are well-known in the art, but additional information and a general circuit arrangement for one exemplary disk drive apparatus may be found, for example, in Wakamatsu U.S. Pat. No. 6,011,666, issued Jan. 4, 2000, the disclosure of which is hereby incorporated herein by reference as if set forth herein in its entirety.

Figure 1:
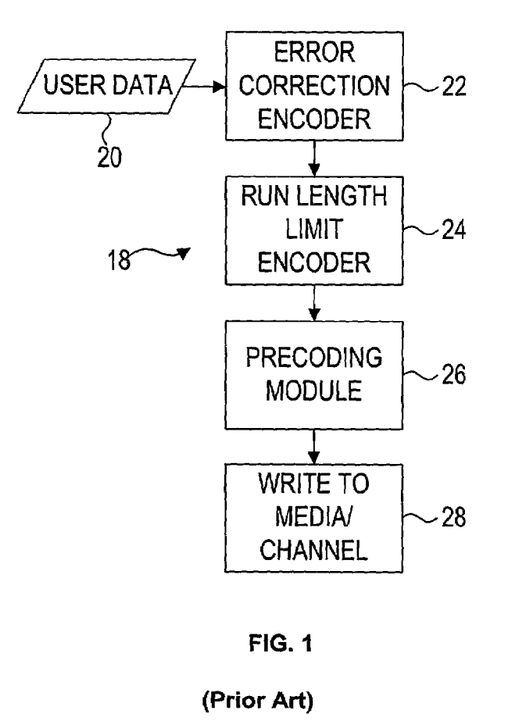
FIG. 1 is a block diagram illustrating one embodiment of a prior-art encoder for encoding user data.

Many different approaches to overcoming this problem with transmission errors have been developed. FIG. 1 illustrates one example of a prior-art write-channel encoder apparatus for encoding information for communication via a channel (or for storage on any suitable media). As shown, an encoder 18 receives user data 20 and sequentially performs error correction coding or ECC (block 22), run length limit or RLL encoding (block 24), and precoding (block 26) on the user data 20 to thereby produce encoded data which is then written to any suitable media and/or any suitable communication channel (block 28).

Figure 2:
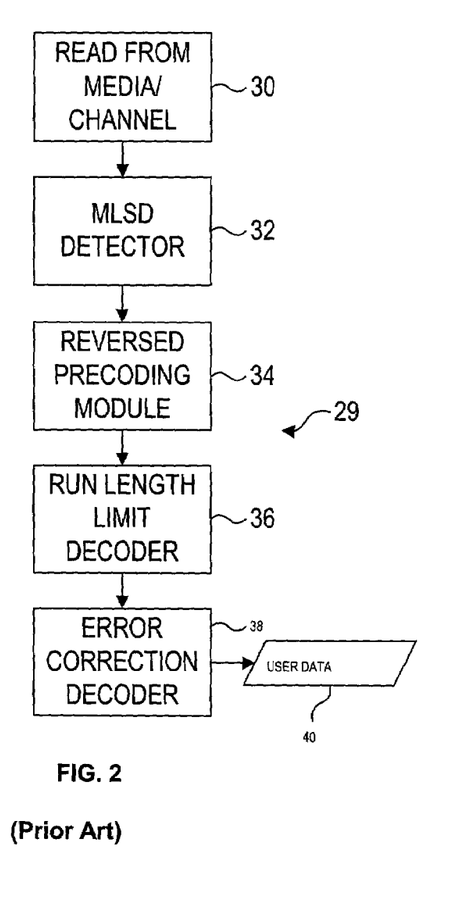
FIG. 2 is a block diagram illustrating a prior-art decoder for decoding information encoded by the encoder of FIG. 1.

An inverse process for decoding the information encoded by the encoder 18 of FIG. 1 is performed by a prior-art read-channel decoding apparatus such as the decoder 29 illustrated in FIG. 2. Initially, the decoder 29 reads or retrieves encoded information from a media source or a communication channel (block 30) and performs a maximum likelihood sequence detection (MLSD) on that encoded information (block 32). As will be appreciated by those of ordinary skill in the art, this MLSD detection compares the retrieved encoded information with a set of all possible information sequences and determines which of the possible sequences most likely represents the encoded information based on which of the possible information sequences is "closest" (e.g., by computing a predetermined error quantification metric for each possible sequence and selecting that sequence which has the smallest or minimum value for the computed error quantification metric).

The read-channel decoder 29 then performs reversed preceding on the detected data sequence (block 34) followed by RLL decoding (block 36) and ECC decoding (block 38) to thereby derive user data 40, which corresponds to the user data 20 encoded by the encoder 18 (FIG. 1).

In this approach, the RLL decoding step in the data recovery process undesirably causes small errors to be propagated into many symbols of error in the decoded message. As will be appreciated by those of ordinary skill in the art, the number of symbol errors that can be fixed by the error correction coding (ECC) is limited by design. Consequently, the RLL decoding used in this approach degrades the final error rate of the data recovery process.

One solution to this problem has been to reduce the size of the actual encoded word to minimize the maximum possible size for error propagation. In the most extreme case, only one symbol is encoded, and the rest of the symbols in the code word are left unencoded.

By way of example, where a communication scheme employs an eight-bit symbol size and an unencoded code word made up of 4 symbols {u1, u2, u3, u4}, the best error correction is obtained by simply encoding one of the symbols into a 9-bit code word. For example, if u1 is encoded to produce a 9-bit code word E1 a final code with low error-propagation can be constructed as follows:

final code={u2, e1a, u3, e1b, u4} where e1a is the first (most significant) 4 bits of the code word E1 and e1b is the last (least significant) 5 bits of the code word E1. In such a scheme, following the decoding process, errors of small size (i.e., over 2 bits more than the smaller of e1a or e1b) can corrupt at most two symbols, which may occur when an error encompasses an unencoded symbol and one of the partially encoded symbols.

The advantage of this kind of simple encoding scheme is in the reduced error propagation after RLL decoding and thus the total number of symbols that can be corrupted by a single error event. As a consequence, this encoding scheme allows for an increase in the total number of error events the error correction coding (ECC) can correct. A significant disadvantage of this scheme is that the smaller encoded symbol makes the minimum Hamming weight of the total code word very small (i.e., equal to the Hamming weight of the single encoded symbol). As will be appreciated by those of ordinary skill in the art, the Hamming weight of a code word or other collection of symbols is defined as the number of non-zero symbols in the code word or collection of symbols in the Interleaved Non-Return to Zero Inverting (INRZI) domain. For binary signaling, the Hamming weight of a bit stream is the number of "1" bits in the bit stream. The read-channel device (i.e., the decoder) performs numerous functions, such as timing and gain recovery, before it passes sampled data to the MLSD detector. The purpose of RLL encoding is not only to remove quasi-catastrophic sequences that can degrade the performance of the MLSD, it is also used to introduce a guaranteed minimum number of signal transitions to allow the gain and timing loops to operate. Codes with high Hamming weight typically provide more signal transitions that can be used for the timing and gain loops. Codes with very low Hamming weight may not provide adequate timing and gain gradients for the channel to provide correct sampling phase and gain control.

This encoding scheme is least effective when every encoded symbol in the entire encoded data field has minimum Hamming weight and all the other unencoded symbols are zeros. The degradation in the timing and gain loops as a result of the channel operating on a sequence of low Hamming weight codes can be so large that it negates the benefit of the reduced error propagation made possible by this encoding scheme.

To mitigate this problem, the storage industry has used data-scrambling technique to minimize the probability of creating a large number of zeros in the user symbols. Unfortunately, this technique merely makes it more difficult for an end-user to locate a bad data sequence. There is still some finite probability that the bad data sequence can be created accidentally by the scrambling of some random data (e.g., random data created by running a string of zero-valued bits through the same randomizer used in the channel). This randomizer technique is therefore less than satisfactory.

Figure 3:
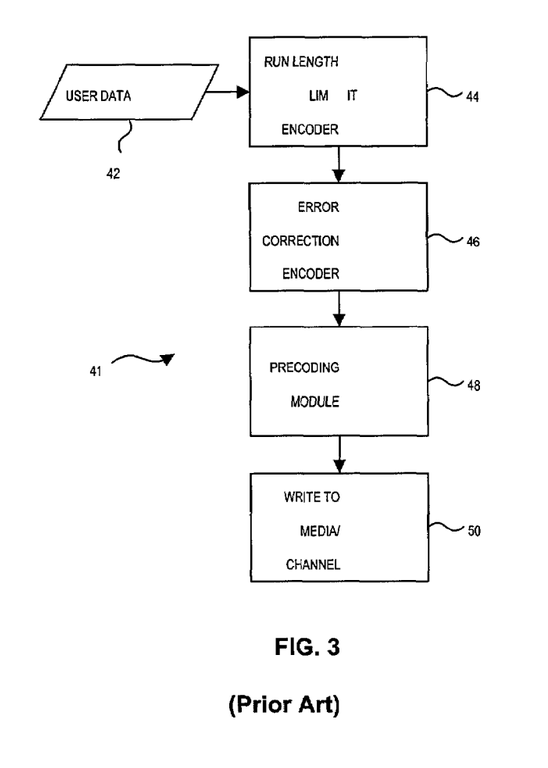
FIG. 3 is a block diagram illustrating a second embodiment of a prior-art encoder.

FIG. 3 illustrates an alternative embodiment of a prior-art write-channel encoder apparatus 41, which is similar to the encoder apparatus 18 of FIG. 1, except that the order in which the error correction coding (ECC) and the run length limit (RLL) encoding are performed is reversed in the encoding apparatus 41 of FIG. 3. In other words, as shown, run length limit encoding is performed on user data 42 (block 44), and error correction coding is subsequently performed (block 46). The result then undergoes precoding (block 48) and the encoded information is then written to any suitable media and/or a communication channel (block 50).

Figure 4:
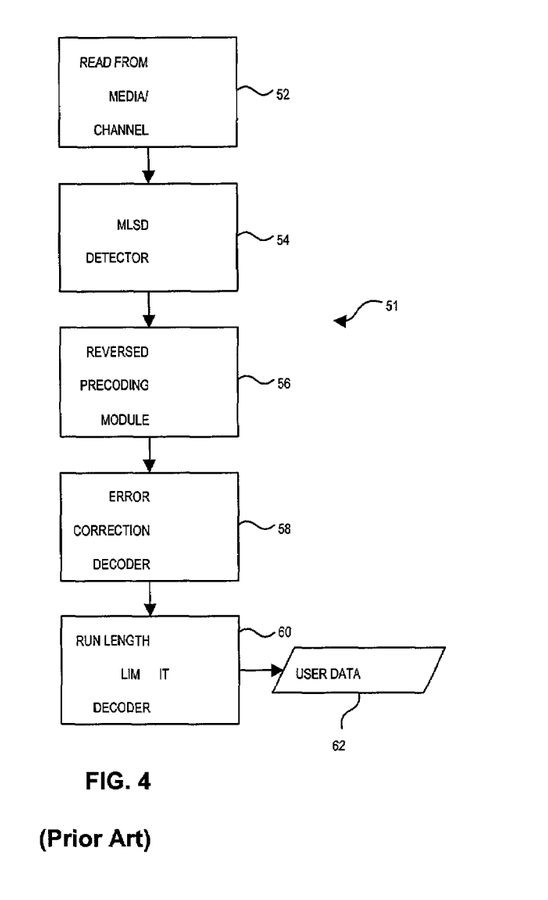
FIG. 4 is a block diagram illustrating a prior-art decoder for decoding information encoded by the encoder of FIG. 3.

Similarly, FIG. 4 illustrates a read-channel decoding apparatus 51 which reads encoded information from a media or a communication channel (block 52) performs MLSD detection (block 54), reversed precoding (block 56), error correction code (ECC) decoding (block 58), and run length limit (RLL) decoding (block 60) to generate user data 62, which corresponds to the user data 42 processed by the encoding apparatus 41 (FIG. 3).

Permuting or reversing the ECC and RLL encoders in the "write" process in this fashion serves to prevent or at least reduce error propagation. In such an encoding scheme, the ECC would correct on the data before RLL decoding, thereby completely avoiding the error propagation effect of RLL decoding. The output after ECC correction is assumed to be perfect user data, such that the RLL decoding following the ECC will not involve any error propagation. This method of recording and data recovery allows RLL code to be designed in such a way as to optimize for Hamming weights and thereby improve the performance of the timing and gain loops of the channel. Thus, the error propagation effect of the previously described encoding scheme are obviated.

While this latter encoding scheme does provide at least a theoretical improvement in terms of reduced error propagation compared to the encoding scheme described above, it also has certain drawbacks due to compatibility issues that arise from the way in which storage devices that employ these encoding schemes are traditionally certified. Traditionally, technical customers of mass storage device often test the ECC capability of a given mass storage device before deciding to purchase the device. A common method of performing such a test involves so-called "read-long" and "write-long" processes.

In a read-long process, the drive or other device is instructed to read a certain data sector and return all the user symbols in that sector, plus the included ECC symbols, to the host. The host then runs a program that deliberately corrupts some number of bits in the received data (i.e., the user symbols and ECC symbols) and returns the corrupted data back to the drive using a write-long command. The write-long command instructs the drive to write all the long data back to the disk without additional ECC. In a subsequent normal read, the data is read back to the host and the host checks whether the ECC during a normal read has corrected the error that the host had deliberately introduced. This process is done repeatedly using long data corrupted at different location with different numbers of group of corrupted bits and different numbers of corrupted bits per group. These read-long and write-long instructions provide a means for the technical user to verify that the drive indeed has the specified error correction capability before deciding to purchase the drive.

A problem with the permuted ECC/RLL scheme is that one corrupted symbol can generate a large number of encoded symbols that are corrupted, assuming that the RLL encoder used is the one that is optimized for the timing and gain loops of the channel. Thus, the conventional read-long and write-long test method will produce a result that appears to suggest that the ECC performance of the drive is vastly inferior to what is claimed by the manufacturer, and a technical customer may decline to purchase the drive because of this adverse test result. This, in turn, will cause the manufacturer of the drive to lose market share to other manufacturers that do not incorporate ECC/RLL permutation. For this reason, the permuted ECC/RLL scheme may not be readily accepted in the storage industry.

SUMMARY

The present invention relates to a method and apparatus for encoding and/or decoding information for storage or communication via a channel with greater reliability than prior methods such as those described above. More particularly, the present invention employs an enhancement to the Hamming weight of data prior to encoding to increase the effectiveness of the ECC and RLL encoding processes.

According to one aspect of the present invention, initial binary data to be communicated or stored is obtained, and the characteristic Hamming weight of the initial binary data is determined. The characteristic Hamming weight of the initial binary data is then compared with a predetermined value, and the initial binary data is processed based on the comparison to thereby develop processed binary data having a Hamming weight not less than the characteristic Hamming weight of the initial binary data. The characteristic Hamming weight of the initial binary data preferably is determined by counting one-valued bits in the initial binary data, and the predetermined value preferably is a predetermined minimum Hamming weight threshold value.

Processing of the initial binary data may comprise bitwise inverting of the initial binary data if the Hamming weight of the initial binary data is less than the predetermined value and may further comprise supplying an indication of whether the Hamming weight of the initial binary data is less than the predetermined value and/or an indication of whether bits of the processed binary data are inverted. Such an indication can comprise a binary digit having a first value if the bits of the processed binary data are inverted and having a second value otherwise. In some embodiments, the indication comprises a binary digit having a first value if the Hamming weight of the initial binary data is less than the predetermined value and having a second value otherwise. Processing of the initial binary data may also comprise performing at least one of error correction coding, run-length encoding, and preceding.

According to another aspect of the invention, communication encoding is performed by a method wherein a first sequence of binary digits that collectively have a characteristic Hamming weight is obtained and each of the binary digits in the first sequence of binary digits is inverted if the Hamming weight of the first sequence of binary digits is below a predetermined threshold Hamming weight value. An indication is provided of whether the binary digits in the first sequence of binary digits have been inverted.

According to yet another aspect of the present invention, a bitstream having a characteristic Hamming weight is communicated to a destination via a channel by determining the characteristic Hamming weight of the bitstream, inverting each bit in the bitstream if the characteristic Hamming weight of the bitstream is below a threshold value and developing an indication of whether the bits in the bitstream are inverted, and delivering the bitstream and the indication of whether the bits in the bitstream are inverted to the destination via the channel. Each bit in the bitstream is then inverted at the destination if the indication indicates that the bits are inverted.

According to still another aspect of the present invention, data is communicated from a source to a destination via a channel by obtaining initial binary data having a characteristic Hamming weight at the source, determining the characteristic Hamming weight of the initial binary data, performing a comparison of the characteristic Hamming weight of the initial binary data with a predetermined value, and processing the initial binary data based on the comparison to thereby develop processed binary data having a Hamming weight not less than the characteristic Hamming weight of the initial binary data. The processed binary data is then conveyed from the source to the destination via the channel, and the processed binary data is received from the source at the destination and the initial binary data is regenerated from the processed binary data.

Communication decoding according to the present invention also may be performed by receiving processed binary data including a binary code word and an indication of whether bits of the binary code word are inverted and inverting each bit of the binary code word if the indication indicates that the bits are inverted.

According to another aspect of the present invention, a communication encoding apparatus includes a data input for receiving initial binary data having a characteristic Hamming weight and a processor in communication with the data input for determining the characteristic Hamming weight of the initial binary data, performing a comparison of the characteristic Hamming weight of the initial binary data with a predetermined value, and processing the initial binary data based on the comparison to thereby develop processed binary data having a Hamming weight not less than the characteristic Hamming weight of the initial binary data.

According to another aspect of the present invention, a communication encoding apparatus comprises an input for receiving a first sequence of binary digits that collectively have a characteristic Hamming weight, a processor for inverting each of the binary digits in the first sequence of binary digits if the Hamming weight of the first sequence of binary digits is below a predetermined threshold Hamming weight value and providing an indication of whether the binary digits in the first sequence of binary digits have been inverted.

According to yet another aspect of the present invention, a system for communicating a bitstream having a characteristic Hamming weight to a destination via a channel comprises a first processor at a source of the bitstream for determining the characteristic Hamming weight of the bitstream and for inverting each bit in the bitstream if the characteristic Hamming weight of the bitstream is below a threshold value and developing an indication of whether the bits in the bitstream are inverted and a second processor at the destination and in communication with the channel for receiving the bitstream and the indication and inverting each bit in the bitstream at the destination if the indication indicates that the bits are inverted. The first processor is in communication with the channel to permit delivery of the bitstream and the indication of whether the bits in the bitstream are inverted to the destination via the channel.

A communication decoder according to the present invention may include a memory for receiving processed binary data including a binary code word and an indication of whether bits of the binary code word are inverted and a processor for inverting each bit of the binary code word if the indication indicates that the bits are inverted.

For carrying out the method of the present invention, a computer-readable medium may be provided having stored thereon a first set of machine-executable instructions for obtaining initial binary data having a characteristic Hamming weight, a second set of machine-executable instructions for determining the characteristic Hamming weight of the initial binary data, a third set of machine-executable instructions for performing a comparison of the characteristic Hamming weight of the initial binary data with a predetermined value, and a fourth set of machine-executable instructions for processing the initial binary data based on the comparison to thereby develop processed binary data having a Hamming weight not less than the characteristic Hamming weight of the initial binary data.

Alternatively, a computer-readable medium in accordance with the principles of the present invention may have stored thereon a first set of machine-executable instructions for obtaining a first sequence of binary digits that collectively have a characteristic Hamming weight, a second set of machine-executable instructions for inverting each of the binary digits in the first sequence of binary digits if the Hamming weight of the first sequence of binary digits is below a predetermined threshold Hamming weight value, and a third set of machine-executable instructions for providing an indication of whether the binary digits in the first sequence of binary digits have been inverted.

In accordance with yet another aspect of the present invention, a computer-readable medium may have machine-executable instructions stored thereon for communicating a bitstream having a characteristic Hamming weight to a destination via a channel. More particularly, the machine-executable instructions may include a first set of machine-executable instructions for determining the characteristic Hamming weight of the bitstream, a second set of machine-executable instructions for inverting each bit in the bitstream if the characteristic Hamming weight of the bitstream is below a threshold value and developing an indication of whether the bits in the bitstream are inverted, a third-set of machine-executable instructions for delivering the bitstream and the indication of whether the bits in the bitstream are inverted to the destination via the channel, and a fourth set of machine-executable instructions for inverting each bit in the bitstream at the destination if the indication indicates that the bits are inverted.

In accordance with another aspect of the present invention, a computer-readable medium may have stored thereon machine-executable instructions for communicating data from a source to a destination via a channel, the machine-executable instructions including a first set for obtaining initial binary data having a characteristic Hamming weight at the source, a second set for determining the characteristic Hamming weight of the initial binary data, a third set for performing a comparison of the characteristic Hamming weight of the initial binary data with a predetermined value, and a fourth set for processing the initial binary data based on the comparison to thereby develop processed binary data having a Hamming weight not less than the characteristic Hamming weight of the initial binary data. A fifth set of machine-executable instructions may be provided for conveying the processed binary data from the source to the destination via the channel.

A disk drive in accordance with the principles of the present invention may include a data input for receiving initial binary data having a characteristic Hamming weight, and a processor in communication with the data input for determining the characteristic Hamming weight of the initial binary data, performing a comparison of the characteristic Hamming weight of the initial binary data with a predetermined value, and processing the initial binary data based on the comparison to thereby develop processed binary data having a Hamming weight not less than the characteristic Hamming weight of the initial binary data.

According to another aspect of the present invention, a disk drive includes an input for receiving a first sequence of binary digits that collectively have a characteristic Hamming weight, a processor for inverting each of the binary digits in the first sequence of binary digits if the Hamming weight of the first sequence of binary digits is below a predetermined threshold Hamming weight value and providing an indication of whether the binary digits in the first sequence of binary digits have been inverted.

DETAILED DESCRIPTION

Although the permuted ECC/RLL encoding scheme described above provides a highly effective technical solution, the possible industry acceptance problem that it may encounter, as also described above, cannot be ignored. Instead of risking loss of market share, it is far easier for a drive manufacturer to accept a different encoding scheme that provides nearly as much benefit as a permuted ECC/RLL scheme, without the attendant difficulty in educating potential customers in how to reliably assess the effectiveness of the encoding scheme used by the drive in correcting errors.

The present invention provides one approach to improving the error-correction performance of an encoding/decoding scheme. Preferably, data is encoded using codes with small error propagation to enhance the effectiveness of the error correction coding (ECC) process. However, such codes generally have very low Hamming weights, such that a secondary encoding scheme is needed to enhance the Hamming weights of the codes while maintaining minimal loss in code rate. Such a secondary encoding scheme must improve the overall Hamming weight of the data sector to be communicated or stored without requiring successful scrambling. In accordance with the principles of the present invention, this secondary encoding scheme may employ a Hamming weight encoder to enhance the Hamming weight of the data to be encoded prior to error correction coding of that data. Also in accordance with the principles of the present invention, the symbol boundary of an encoded symbol advantageously may be left unchanged relative to the error correction coding.

Figure 5:
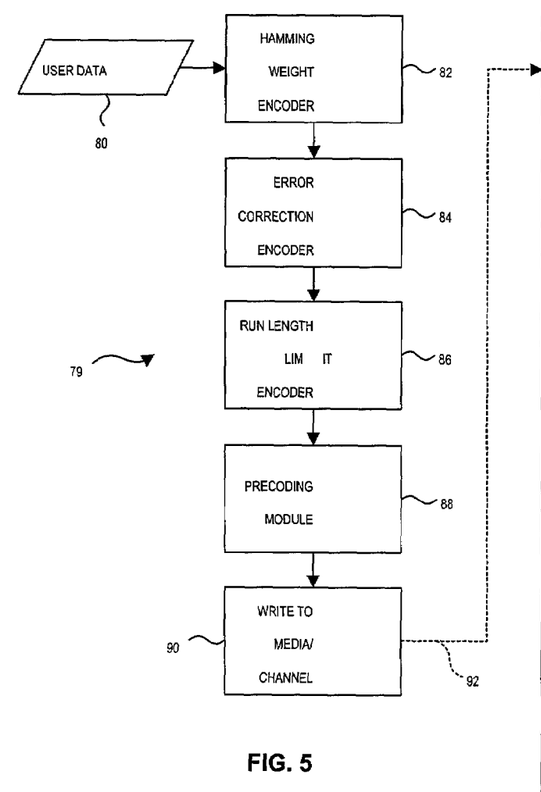
FIG. 5 is a block diagram illustrating one exemplary embodiment of an encoder for encoding information in accordance with the method of the present invention.

One exemplary write-channel encoding apparatus 79 for encoding data in accordance with the principles of the present invention is illustrated in FIG. 5. The illustrated encoding apparatus 79 receives user data 80 comprising a stream of binary digits or bits of information. This stream of bits undergoes Hamming weight encoding (block 82), error correction coding (block 84), run length limit encoding (block 86), and precoding (block 88), and the resulting Hamming-weight-enhanced encoded bitstream is written to a conventional medium or a communication channel (block 90).

A dotted line 92 interconnecting the encoding apparatus 79 of FIG. 5 with a read-channel decoding apparatus 93 (shown in FIG. 6) represents the media and/or the communication channel to which the encoded bit stream is written (block 90).

Figure 6:
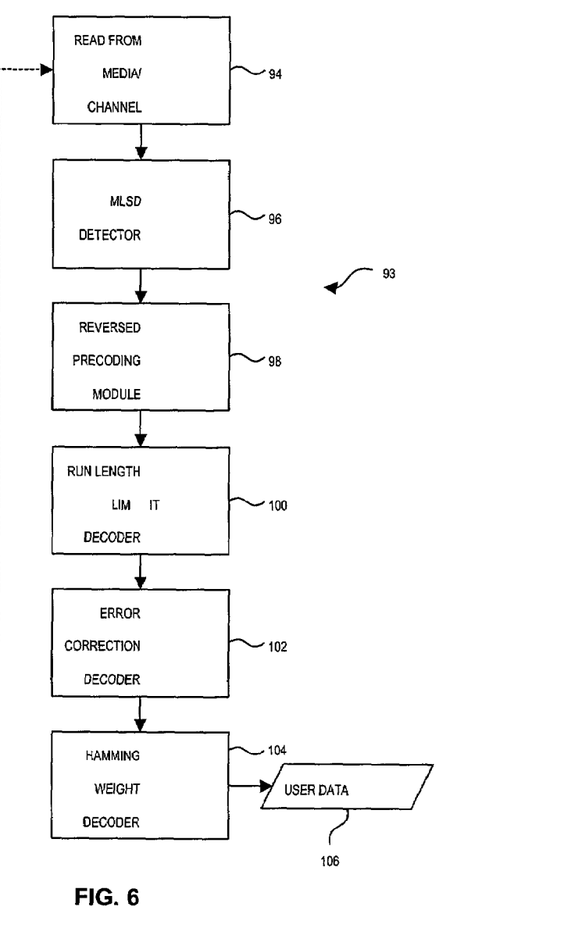
FIG. 6 is a block diagram illustrating one exemplary embodiment of a decoder for decoding information in accordance with the method of the present invention, such as, for example, information encoded by the encoder of FIG. 5.

As shown in FIG. 6, the decoding apparatus 93 reads the encoded bit stream from the media or channel 92 (block 94) and performs MLSD detection (block 96), reversed precoding (block 98), run length limit decoding (block 100), error correction decoding (block 102), and Hamming weight decoding (block 104) to thereby develop user data 106, which corresponds to the user data 80 processed by the encoding apparatus 79 of FIG. 5.

The Hamming weight encoder preferably has knowledge about the data symbols that will not be RLL encoded by the RLL encoder. The user data 80, in the aggregate, is divided into several large groups of symbols. Each group is analyzed, and the total Hamming weight for the portion that is not to be RLL encoded is determined. This total Hamming weight is then compared with a predetermined threshold Hamming weight value (e.g., a value equivalent to 50 percent of the length of the group of bits of the user data 80). If the total Hamming weight is too small (i.e., is less than the predetermined threshold Hamming weight value), then all of the bits in this group are inverted. An additional bit or flag is appended at the end of the user data 80 to provide an indication of 4 whether or not the bits in the group have been inverted. As will be readily apparent to those of ordinary skill in the art, this procedure ensures that the group of bits of data to be encoded has a Hamming weight that is at least as great as 50% of the size of the group.

By using groups of a relatively large size (e.g., on the order of hundreds of bits per group), the total number of extra "code inversion tracking" or "flag" bits appended by the Hamming weight encoder (and the percentage of the total encoded bitstream occupied by those flag bits) can be minimized. This ensures that the performance of the channel is not significantly degraded by code rate loss. Of course, it is possible that the Hamming weight encoder 82 looks at the Hamming weight of the whole group including the encoded code word. Such an approach is not preferable, but it does not materially affect the performance of the encoding system, because the RLL encoding is designed to provide a minimal number of RLL-encoded symbols per code word. It is also possible that the Hamming weight encoder 82 looks at only some of the unencoded symbols as opposed to all of them, as well as that encoded symbols are also included in the Hamming weight calculation and Hamming weight encoding. Again this is not preferable but it may be done in the interest of increasing the total Hamming weight of the data written to the media or communication channel.

On the read back side (i.e., in the decoder 93), the ECC process is assumed to have fully corrected all the errors such that all of the code inversion tracking bits may, in turn, be assumed to be correct. As a consequence, the Hamming weight decoder 104 can reliably invert the symbols that have been inverted by the Hamming weight encoding process.

As an illustrative example, user data 80 may be organized in 10-bit symbols U1, U2, U3, U4, . . . Un. An RLL code is employed such that for each 3-symbol sequence {u1,u2,u3}, u1 is encoded to E1 and separated into e1a and e1b; u2 and u3 are unencoded; and the final RLL code word is constructed as{e1a, u2, e1b, u3}. Thus, U2, U3, U5, U6, U8, and U9, and so on, will not be encoded. The Hamming weight encoder 82 may choose to operate over a group of, for example, 51 symbols. The total number of symbols that will not be RLL-encoded in this group is then 34. The Hamming weight encoder takes the sum of the one-valued bits in this 34 symbols, and, if the sum is less than 34*10/2=170, then all of the bits in the 34 symbols will be inverted. A one-valued bit is then appended at the end of the user data 80 to indicate that the group has been inverted. If the group is not inverted, a zero-valued bit is appended.

The Hamming weight encoder 82 repeats this procedure for all groups of bits in the user data 80.

Although the user data 80 may not be divisible into Hamming weight encoding groups of equal size in every instance, this does not affect the performance of the Hamming weight encoding method of the present invention. However, it is preferable for all of the Hamming weight encoding groups to have equal size, if possible, so that the Hamming weight decoder 104 need only keep track of the typical group size and the last group size (which may differ due to a remainder of bits following division of the user data 80 into a number of groups of equal size). It is also possible for small groups of data to remain unencoded as long as the controller keeps track of the encoding format applied so that the decoding process can be done correctly. Although scrambling of data is more commonly done after ECC encoding, in accordance with the principles of the present invention, it is preferable, but not absolutely necessary, that scrambling be done before Hamming weight encoding.

While the present invention will be described with respect to an encoder for use in general purpose computers (e.g., in disk drives, printers, routers, etc.), it is to be understood that the present invention may also find applicability in other noisy channels (e.g., wireless, etc.) and even in other fields such as Internet communications, telecommunications, or any processor-to-processor applications. Also, rather than being embodied in discrete card, the method and apparatus of the present invention alternatively may advantageously be incorporated directly into a computer "mother board" or any other suitable hardware configuration, if desired.

The foregoing description is for the purpose of teaching those skilled in the art the best mode of carrying out the invention and is to be construed as illustrative only. Numerous modifications and alternative embodiments of the invention will be apparent to those skilled in the art in view of this description, and the details of the disclosed structure may be varied substantially without departing from the spirit of the invention. Accordingly, the exclusive use of all modifications within the scope of the appended claims is reserved.

What is claimed is:

1. A Hamming weight encoder, comprising:
   an input that receives user data including P symbols;
   a Hamming weight module that determines a Hamming weight of N of said P symbols, wherein N and P are integers greater than one and N is less than or equal to P;
   a comparing module that compares the Hamming weight to a Hamming weight threshold; and
   an inverting module that selectively bitwise inverts bits in said N symbols based on said comparison.

2. The Hamming weight encoder of claim 1 wherein said Hamming weight encoder appends at least one inversion bit to said N symbols.

3. The Hamming weight encoder of claim 1 wherein N and P are equal.

4. A system comprising the Hamming weight encoder of claim 1 and further comprising an error correction coding (ECC) module that performs ECC on at least one of said P symbols.

5. The system of claim 4 further comprising a run length limit (RLL) encoder that performs RLL encoding on an output of said ECC module.

6. The system of claim 5 wherein P is equal to N plus M, wherein said RLL encoder RLL encodes M symbols and does not RLL encode said N symbols, where M is an integer greater than zero.

7. The system of claim 6 wherein said Hamming weight module generates said Hamming weight for said N symbols and said comparing module compares said Hamming weight for said N symbols to said Hamming threshold.

8. The Hamming weight encoder of claim 1 wherein said Hamming weight is equal to a number of ones in said N symbols.

9. The Hamming weight encoder of claim 1 wherein said inverting module selectively inverts said N symbols when inverting increases said Hamming weight.

10. The Hamming weight encoder of claim 1 wherein said N symbols of said user data have a first Hamming weight, and wherein said N symbols output by said inverting module have a second Hamming weight that is greater than or equal to said first Hamming weight.

11. A communications channel comprising:
    a Hamming weight encoder comprising:
       an input that receives user data including P symbols;
       a Hamming weight module that determines a Hamming weight of N of said P symbols, wherein N and P are integers greater than one, P is equal to N plus M, and M is an integer greater than zero;
       a comparing module that compares the Hamming weight to a Hamming weight threshold; and
       an inverting module that selectively bitwise inverts bits in said N symbols based on said comparison; and
    a run length limit (RLL) encoder that RLL encodes said M symbols and does not RLL encode said N symbols.

12. The Hamming weight encoder of claim 11 wherein said Hamming weight encoder appends at least one inversion bit to said P symbols.

13. A system comprising the Hamming weight encoder of claim 11 and further comprising an error correction coding (ECC) module that performs ECC on at least one of said P symbols.

14. The Hamming weight encoder of claim 11 wherein said Hamming weight is equal to a number of ones in said N symbols.

15. The Hamming weight encoder of claim 11 wherein said inverting module selectively inverts said N symbols when said inverting increases said Hamming weight.

16. The Hamming weight encoder of claim 11 wherein said N symbols of said user data have a first Hamming weight, and wherein said N symbols output by said inverting module have a second Hamming weight that is greater than or equal to said first Hamming weight.

17. A Hamming weight encoder, comprising:
input means for receiving user data including P symbols;
Hamming weight means for determining a Hamming weight of N of said P symbols, wherein N and P are integers greater than one and N is less than or equal to P;
comparing means for comparing the Hamming weight to a Hamming weight threshold; and
inverting means for selectively bitwise inverting bits in said N symbols based on said comparison.

18. The Hamming weight encoder of claim 17 wherein said inverting means appends at least one inversion bit to said N symbols.

19. The Hamming weight encoder of claim 17 wherein N and P are equal.

20. A system comprising the Hamming weight encoder of claim 17 and further comprising error correction coding (ECC) means for performing ECC on at least one of said P symbols.

21. The system of claim 20 further comprising run length limit (RLL) encoding means for performing RLL encoding on an output of said ECC means.

22. The system of claim 21 wherein P is equal to N plus M, wherein said RLL encoding means RLL encodes said M symbols and does not RLL encode said N symbols, where M is an integer greater than zero.

23. The system of claim 22 wherein said Hamming weight means generates said Hamming weight for said N symbols and said comparing means compares said Hamming weight for said N symbols to said Hamming threshold.

24. The Hamming weight encoder of claim 17 wherein said Hamming weight is equal to a number of ones in said N symbols.

25. The Hamming weight encoder of claim 17 wherein said inverting means selectively inverts said N symbols when inverting increases said Hamming weight.

26. The Hamming weight encoder of claim 17 wherein said N symbols of said user data have a first Hamming weight, and wherein said N symbols output by said inverting means have a second Hamming weight that is greater than or equal to said first Hamming weight.

27. A communications channel comprising:
Hamming weight encoding means for encoding comprising:
input means for receiving user data including P symbols;
Hamming weight means for determining a Hamming weight of N of said P symbols, wherein N and P are integers greater than one, M is an integer greater than zero, and P is equal to N plus M;
comparing means for comparing the Hamming weight to a Hamming weight threshold; and
inverting means for selectively bitwise inverting bits in said N symbols based on said comparison; and
run length limit (RLL) encoding means for RLL encoding said M symbols and not RLL encoding said N symbols.

28. The Hamming weight encoder of claim 27 wherein said inverting means appends at least one inversion bit to said P symbols.

29. A system comprising the Hamming weight encoder of claim 27 and further comprising error correction coding (ECC) means for performing ECC on at least one of said P symbols.

30. The Hamming weight encoder of claim 27 wherein said Hamming weight is equal to a number of ones in said N symbols.

31. The Hamming weight encoder of claim 27 wherein said inverting means selectively inverts said N symbols when said inverting increases said Hamming weight.

32. The Hamming weight encoder of claim 27 wherein said N symbols of said user data have a first Hamming weight, and wherein said N symbols output by said inverting means have a second Hamming weight that is greater than or equal to said first Hamming weight.

33. A method for operating a Hamming weight encoder, comprising:
receiving user data including P symbols;
determining a Hamming weight of N of said P symbols, wherein N and P are integers greater than one and N is less than or equal to P;
comparing the Hamming weight to a Hamming weight threshold; and
selectively bitwise inverting bits in said N symbols based on said comparison.

34. The method of claim 33 wherein said Hamming weight encoder appends inversion data to said N symbols.

35. The method of claim 33 wherein N and P are equal.

36. The method of claim 33 further comprising performing ECC on at least one of said P symbols.

37. The method of claim 36 further comprising performing RLL encoding.

38. The method of claim 37 wherein P is equal to N plus M and further comprising RLL encoding said M symbols and not RLL encoding said N symbols, where M is an integer greater than zero.

39. The method of claim 38 further comprising:
generating said Hamming weight for said N symbols; and
comparing said Hamming weight for said N symbols to said Hamming threshold.

40. The method of claim 33 wherein said Hamming weight is equal to a number of ones in said N symbols.

41. The method of claim 33 further comprising selectively inverting said N symbols when said inverting increases said Hamming weight.

42. The method of claim 33 wherein said N symbols of said user data have a first Hamming weight, and wherein said N symbols after said inverting have a second Hamming weight that is greater than or equal to said first Hamming weight.

43. A communications channel comprising:
receiving user data including P symbols;
determining a Hamming weight of N of said P symbols, wherein N and P are integers greater than one, M is an integer greater than zero, and P is equal to N plus M;
comparing the Hamming weight to a Hamming weight threshold;

selectively bitwise inverting bits in said N symbols based on said comparison;
RLL encoding said M symbols; and
not RLL encoding said N symbols.

44. The method of claim 43 further comprising appending at least one inversion bit to said P symbols.

45. The method of claim 43 further comprising performing ECC on at least one of said P symbols.

46. The Hamming weight encoder of claim 43 wherein said Hamming weight is equal to a number of ones in said N symbols.

47. The Hamming weight encoder of claim 43 wherein said inverting selectively inverts said N symbols when said inverting increases said Hamming weight.

48. The Hamming weight encoder of claim 43 wherein said N symbols of said user data have a first Hamming weight, and wherein said N symbols output after said inverting have a second Hamming weight that is greater than or equal to said first Hamming weight.

49. A method for operating a Hamming weight encoder, comprising:
receiving user data including P symbols;
determining a Hamming weight of N of said P symbols, wherein N and P are integers greater than one and N is less than or equal to P;
comparing the Hamming weight to a Hamming weight threshold; and
selectively bitwise inverting bits in said N symbols based on said comparison.

50. The method of claim 49 wherein said Hamming weight encoder appends inversion data to said N symbols.

51. The method of claim 49 wherein N and P are equal.

52. The method of claim 49 further comprising performing ECC on at least one of said P symbols.

53. The method of claim 52 further comprising performing RLL encoding.

54. The method of claim 53 wherein P symbols is equal to N plus M and further comprising RLL encoding said M symbols and not RLL encoding said N symbols, where M is an integer greater than zero.

55. The method of claim 54 further comprising:
generating said Hamming weight for said N symbols; and
comparing said Hamming weight for said N symbols to said Hamming threshold.

56. The method of claim 49 wherein said Hamming weight is equal to a number of ones in said N symbols.

57. The method of claim 49 further comprising selectively inverting said N symbols when said inverting increases said Hamming weight.

58. The method of claim 49 wherein said N symbols of said user data have a first Hamming weight, and wherein said N symbols after said inverting have a second Hamming weight that is greater than or equal to said first Hamming weight.

59. A method of operating a communications channel comprising:
receiving user data including P symbols;
determining a Hamming weight of N of said P symbols, wherein N and P are integers greater than one, M is an integer greater than zero, and P is equal to N plus M;
comparing the Hamming weight to a Hamming weight threshold;
selectively bitwise inverting bits in said N symbols based on said comparison;
RLL encoding said M symbols; and
not RLL encoding said N symbols.

60. The method of claim 59 further comprising appending at least one inversion bit to said P symbols.

61. The method of claim 59 further comprising performing ECC on at least one of said P symbols.

62. The method of claim 59 wherein said Hamming weight is equal to a number of ones in said N symbols.

63. The method of claim 59 wherein said inverting selectively inverts said N symbols when said inverting increases said Hamming weight.

64. The method of claim 59 wherein said N symbols of said user data have a first Hamming weight, and wherein said N symbols output after said inverting have a second Hamming weight that is greater than or equal to said first Hamming weight.

65. A computer program stored for use by a processor for operating a Hamming weight encoder, comprising:
receiving user data including P symbols;
determining a Hamming weight of N of said P symbols, wherein N and P are integers greater than one and N is less than or equal to P;
comparing the Hamming weight to a Hamming weight threshold; and
selectively bitwise inverting bits in said N symbols based on said comparison.

66. The computer program of claim 65 wherein said Hamming weight encoder appends inversion data to said N symbols.

67. The computer program of claim 65 wherein N and P are equal.

68. The computer program of claim 65 further comprising performing ECC on at least one of said P symbols.

69. The computer program of claim 68 further comprising performing RLL encoding.

70. The computer program of claim 69 wherein P is equal to N plus M and further comprising RLL encoding said M symbols and not RLL encoding said N symbols, where M is an integer greater than zero.

71. The computer program of claim 70 further comprising:
generating said Hamming weight for said N symbols; and
comparing said Hamming weight for said N symbols to said Hamming threshold.

72. The computer program of claim 65 wherein said Hamming weight is equal to a number of ones in said N symbols.

73. The computer program of claim 65 further comprising inverting said N symbols when said inverting increases said Hamming weight.

74. The computer program of claim 65 wherein said N symbols of said user data have a first Hamming weight, and wherein said N symbols after said inverting have a second Hamming weight that is greater than or equal to said first Hamming weight.

75. A computer program stored for use by a processor for operating a communications channel comprising:
receiving user data including P symbols;
determining a Hamming weight of N of said P symbols, wherein N and P are integers greater than one, M is an integer greater than zero, and P is equal to N plus M;
comparing the Hamming weight to a Hamming weight threshold;
selectively bitwise inverting bits in said N symbols based on said comparison;
RLL encoding said M symbols; and
not RLL encoding said N symbols.

76. The computer program of claim 75 further comprising appending at least one inversion bit to said P symbols.

77. The computer program of claim 75 further comprising performing ECC on at least one of said P symbols.

78. The computer program of claim 75 wherein said Hamming weight is equal to a number of ones in said N symbols.

79. The computer program of claim 75 wherein said inverting selectively inverts said N symbols when said inverting increases said Hamming weight.

80. The computer program of claim 75 wherein said N symbols of said user data have a first Hamming weight, and wherein said N symbols output after said inverting have a second Hamming weight that is greater than or equal to said first Hamming weight.

\* \* \* \* \*

UNITED STATES PATENT AND TRADEMARK OFFICE
CERTIFICATE OF CORRECTION

PATENT NO. : 7,149,955 B1
APPLICATION NO. : 10/074747
DATED : December 12, 2006
INVENTOR(S) : Pantas Sutardja et al.

It is certified that error appears in the above-identified patent and that said Letters Patent is hereby corrected as shown below:

Column 2, Line 6:   Delete "preceding" and insert --precoding--
Column 5, Line 2:   Delete "preceding" and insert --precoding--
Column 8, Line 38:  Delete "preceding" and insert --precoding--
Column 8, Line 57:  Delete "4" before "whether"

Signed and Sealed this

Twenty-second Day of May, 2007

JON W. DUDAS
*Director of the United States Patent and Trademark Office*